United States Patent
Van Gompel et al.

(10) Patent No.: US 7,528,078 B2
(45) Date of Patent: May 5, 2009

(54) PROCESS OF FORMING ELECTRONIC DEVICE INCLUDING A DENSIFIED NITRIDE LAYER ADJACENT TO AN OPENING WITHIN A SEMICONDUCTOR LAYER

(75) Inventors: Toni D. Van Gompel, Austin, TX (US); Kuang-Hsin Chen, Austin, TX (US); Laegu Kang, Austin, TX (US); Rode R. Mora, Austin, TX (US); Michael D. Turner, San Antonio, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 227 days.

(21) Appl. No.: 11/433,298

(22) Filed: May 12, 2006

(65) Prior Publication Data

US 2007/0264839 A1    Nov. 15, 2007

(51) Int. Cl.
  *H01L 21/31* (2006.01)
  *H01L 21/469* (2006.01)
(52) U.S. Cl. .................. 438/792; 438/404; 438/757; 257/E21.561; 257/E21.564
(58) Field of Classification Search .................. 438/758, 438/792, 404, 405, 445, 757, 735; 257/E21.628, 257/E21.564, E21.559, E21.561
  See application file for complete search history.

(56) References Cited

U.S. PATENT DOCUMENTS

| | | | |
|---|---|---|---|
| 4,659,392 A | 4/1987 | Vasudev | |
| 4,702,796 A | 10/1987 | Nakajima et al. | |
| 5,099,304 A | 3/1992 | Takemura et al. | |
| 5,258,318 A | 11/1993 | Buti et al. | |
| 5,344,785 A | 9/1994 | Jerome et al. | |
| 5,391,501 A | 2/1995 | Usami et al. | |
| 5,395,789 A | 3/1995 | Beitman | |
| 5,443,661 A | 8/1995 | Oguro et al. | |
| 5,451,541 A | 9/1995 | Sugiyama | |

(Continued)

FOREIGN PATENT DOCUMENTS

WO   2005112124 A2   11/2005

(Continued)

OTHER PUBLICATIONS

Sze, S.M., "VLSI Technology," Bell Telephone Laboratories, Inc., New Jersey, 1983, pp. 111-113.

(Continued)

*Primary Examiner*—Caridad M Everhart (57) ABSTRACT

A process of forming an electronic device can include patterning a semiconductor layer to define an opening extending to an insulating layer, wherein the insulating layer lies between a substrate and the semiconductor layer. After patterning the semiconductor layer, the opening can have a bottom, and the semiconductor layer can have a sidewall and a surface. The surface can be spaced apart from the insulating layer, and the sidewall can extend from the surface towards the insulating layer. The process can also include depositing a nitride layer within the opening, wherein depositing is performed using a PECVD technique. The process can further include densifying the nitride layer. The process can still further include removing a part of the nitride layer, wherein a remaining portion of the nitride layer can lie within the opening and be spaced apart from the surface.

20 Claims, 4 Drawing Sheets

U.S. PATENT DOCUMENTS

| | | | |
|---|---|---|---|
| 5,478,408 A | 12/1995 | Mitani et al. | |
| 5,559,357 A | 9/1996 | Krivokapic | |
| 5,571,738 A | 11/1996 | Krivokapic | |
| 5,578,518 A | 11/1996 | Koike et al. | |
| 5,585,661 A | 12/1996 | McLachlan et al. | |
| 5,767,563 A | 6/1998 | Imam et al. | |
| 5,773,314 A | 6/1998 | Jiang et al. | |
| 5,825,696 A | 10/1998 | Hidaka et al. | |
| 5,837,612 A | 11/1998 | Ajuria et al. | |
| 5,867,420 A | 2/1999 | Alsmeier | |
| 5,872,058 A | 2/1999 | Van Cleemput et al. | |
| 5,895,253 A | 4/1999 | Akram | |
| 5,904,540 A | 5/1999 | Sheng et al. | |
| 5,907,771 A | 5/1999 | Ploessl et al. | |
| 5,938,885 A | 8/1999 | Huang et al. | |
| 5,960,289 A | 9/1999 | Tsui et al. | |
| 5,969,401 A | 10/1999 | Hamajima | |
| 5,972,758 A | 10/1999 | Liang | |
| 5,985,735 A | 11/1999 | Moon et al. | |
| 5,989,978 A | 11/1999 | Peidous | |
| 6,004,850 A | 12/1999 | Lucas et al. | |
| 6,008,526 A | 12/1999 | Kim | |
| 6,020,091 A | 2/2000 | Lee | |
| 6,033,997 A | 3/2000 | Perng | |
| 6,034,388 A | 3/2000 | Brown et al. | |
| 6,046,477 A | 4/2000 | Noble | |
| 6,054,750 A | 4/2000 | Imam et al. | |
| 6,059,877 A | 5/2000 | Bruel | |
| 6,071,822 A | 6/2000 | Donohue et al. | |
| 6,080,638 A | 6/2000 | Lin et al. | |
| 6,091,647 A | 7/2000 | Hidaka et al. | |
| 6,096,612 A | 8/2000 | Houston | |
| 6,106,678 A | 8/2000 | Shufflebotham et al. | |
| 6,110,801 A | 8/2000 | Tsai et al. | |
| 6,118,168 A | 9/2000 | Moon et al. | |
| 6,121,133 A | 9/2000 | Iyer et al. | |
| 6,124,206 A | 9/2000 | Flietner et al. | |
| 6,140,207 A | 10/2000 | Lee | |
| 6,146,970 A | 11/2000 | Witek et al. | |
| 6,150,190 A | 11/2000 | Stankus et al. | |
| 6,150,212 A | 11/2000 | Divakaruni et al. | |
| 6,150,238 A | 11/2000 | Wu et al. | |
| 6,165,906 A | 12/2000 | Bandyopadhyay et al. | |
| 6,171,962 B1 | 1/2001 | Karlsson et al. | |
| 6,174,784 B1 | 1/2001 | Forbes | |
| 6,185,472 B1 | 2/2001 | Onga et al. | |
| 6,190,950 B1 | 2/2001 | Noble | |
| 6,200,873 B1 | 3/2001 | Schrems et al. | |
| 6,215,145 B1 | 4/2001 | Noble | |
| 6,238,967 B1 | 5/2001 | Shiho et al. | |
| 6,255,171 B1 | 7/2001 | Noble | |
| 6,258,676 B1 | 7/2001 | Lee et al. | |
| 6,262,468 B1 | 7/2001 | Imam et al. | |
| 6,271,143 B1 | 8/2001 | Mendicino | |
| 6,277,709 B1 | 8/2001 | Wang et al. | |
| 6,288,949 B1 | 9/2001 | Hidaka et al. | |
| 6,294,820 B1 | 9/2001 | Lucas et al. | |
| 6,300,665 B1 | 10/2001 | Peeters et al. | |
| 6,303,413 B1 | 10/2001 | Kalnitsky et al. | |
| 6,306,723 B1 | 10/2001 | Chen et al. | |
| 6,326,313 B1 * | 12/2001 | Couteau et al. | 438/745 |
| 6,333,232 B1 | 12/2001 | Kunikiyo | |
| 6,342,733 B1 | 1/2002 | Hu et al. | |
| 6,346,732 B1 | 2/2002 | Mizushima et al. | |
| 6,350,655 B2 | 2/2002 | Mizuo | |
| 6,358,813 B1 | 3/2002 | Holmes et al. | |
| 6,368,941 B1 | 4/2002 | Chen et al. | |
| 6,385,159 B2 | 5/2002 | Hidaka et al. | |
| 6,395,621 B1 | 5/2002 | Mizushima et al. | |
| 6,406,962 B1 | 6/2002 | Agnello et al. | |
| 6,410,429 B1 | 6/2002 | Ho et al. | |
| 6,429,061 B1 | 8/2002 | Rim | |
| 6,429,066 B1 | 8/2002 | Brown et al. | |
| 6,432,845 B1 | 8/2002 | Morozumi et al. | |
| 6,440,817 B2 | 8/2002 | Trivedi | |
| 6,452,229 B1 | 9/2002 | Krivokapic | |
| 6,465,296 B1 | 10/2002 | Quek et al. | |
| 6,479,361 B1 | 11/2002 | Park | |
| 6,482,715 B2 | 11/2002 | Park et al. | |
| 6,495,430 B1 | 12/2002 | Tsai et al. | |
| 6,506,660 B2 | 1/2003 | Holmes et al. | |
| 6,506,662 B2 | 1/2003 | Ogura et al. | |
| 6,509,234 B1 | 1/2003 | Krivokapic | |
| 6,521,510 B1 | 2/2003 | Fisher et al. | |
| 6,521,947 B1 | 2/2003 | Ajmera et al. | |
| 6,524,929 B1 | 2/2003 | Xiang et al. | |
| 6,531,377 B2 | 3/2003 | Knorr et al. | |
| 6,534,379 B1 | 3/2003 | Fisher et al. | |
| 6,541,382 B1 | 4/2003 | Cheng et al. | |
| 6,548,382 B1 | 4/2003 | Henley et al. | |
| 6,576,949 B1 | 6/2003 | Park | |
| 6,577,522 B2 | 6/2003 | Hidaka et al. | |
| 6,580,138 B1 | 6/2003 | Kubena et al. | |
| 6,583,440 B2 | 6/2003 | Yasukawa | |
| 6,583,488 B1 | 6/2003 | Xiang | |
| 6,602,792 B2 | 8/2003 | Hsu | |
| 6,613,649 B2 | 9/2003 | Lim et al. | |
| 6,617,646 B2 | 9/2003 | Parab | |
| 6,632,374 B1 | 10/2003 | Rosa et al. | |
| 6,638,799 B2 | 10/2003 | Kotani | |
| 6,642,557 B2 | 11/2003 | Liang | |
| 6,645,867 B2 | 11/2003 | Dokumaci et al. | |
| 6,649,457 B2 | 11/2003 | Hsu et al. | |
| 6,653,674 B2 | 11/2003 | Quek et al. | |
| 6,656,817 B2 | 12/2003 | Divakaruni et al. | |
| 6,657,276 B1 | 12/2003 | Karlsson et al. | |
| 6,670,682 B1 | 12/2003 | Mouli | |
| 6,687,446 B2 | 2/2004 | Arakawa | |
| 6,693,018 B2 | 2/2004 | Kim et al. | |
| 6,709,935 B1 | 3/2004 | Yu | |
| 6,713,357 B1 | 3/2004 | Wang et al. | |
| 6,720,606 B1 | 4/2004 | Nitayama et al. | |
| 6,737,345 B1 | 5/2004 | Lin et al. | |
| 6,737,706 B2 | 5/2004 | Lee et al. | |
| 6,740,933 B2 | 5/2004 | Yoo et al. | |
| 6,747,333 B1 | 6/2004 | Xiang et al. | |
| 6,753,201 B2 | 6/2004 | Muto et al. | |
| 6,764,908 B1 | 7/2004 | Kadosh et al. | |
| 6,764,951 B1 * | 7/2004 | van Ngo | 438/687 |
| 6,768,662 B2 | 7/2004 | Hidaka et al. | |
| 6,780,728 B2 | 8/2004 | Tran | |
| 6,787,422 B2 | 9/2004 | Ang et al. | |
| 6,791,138 B2 | 9/2004 | Weimer et al. | |
| 6,797,323 B1 | 9/2004 | Kashiwagi et al. | |
| 6,797,579 B2 | 9/2004 | Yoo et al. | |
| 6,798,038 B2 | 9/2004 | Sato et al. | |
| 6,803,270 B2 | 10/2004 | Dokumachi et al. | |
| 6,812,091 B1 | 11/2004 | Gruening et al. | |
| 6,812,115 B2 | 11/2004 | Wieczorek et al. | |
| 6,818,482 B1 | 11/2004 | Horch et al. | |
| 6,825,529 B2 | 11/2004 | Chidambarrao et al. | |
| 6,828,210 B2 | 12/2004 | Kim et al. | |
| 6,828,211 B2 | 12/2004 | Chi | |
| 6,830,890 B2 | 12/2004 | Lockhart et al. | |
| 6,831,292 B2 | 12/2004 | Currie et al. | |
| 6,835,997 B1 | 12/2004 | Horch et al. | |
| 6,867,433 B2 | 3/2005 | Yeo et al. | |
| 6,887,798 B2 | 5/2005 | Deshpande et al. | |
| 6,903,384 B2 | 6/2005 | Hsu et al. | |
| 6,955,955 B2 | 10/2005 | Chen et al. | |
| 6,973,835 B2 * | 12/2005 | Rangsten et al. | 73/754 |
| 6,974,749 B2 | 12/2005 | Lai et al. | |
| 6,979,627 B2 | 12/2005 | Yeap et al. | |
| 7,230,270 B2 | 6/2007 | Chen et al. | |

| | | | |
|---|---|---|---|
| 7,268,024 | B2 | 9/2007 | Yeo et al. |
| 7,316,981 | B2 | 1/2008 | Fucsko et al. |
| 2003/0057505 | A1* | 3/2003 | Ebina et al. ............... 257/411 |
| 2003/0087506 | A1 | 5/2003 | Kirchhoff |
| 2003/0203632 | A1* | 10/2003 | Heo et al. .................. 438/690 |
| 2003/0209760 | A1 | 11/2003 | Maruyama |
| 2004/0135138 | A1 | 7/2004 | Hsu et al. |
| 2005/0145937 | A1 | 7/2005 | Chen et al. |

FOREIGN PATENT DOCUMENTS

| | | | |
|---|---|---|---|
| WO | 2005112124 | A3 | 11/2005 |
| WO | 2006050051 | A2 | 5/2006 |
| WO | 2006050051 | A3 | 5/2006 |

OTHER PUBLICATIONS

Wolf, S. et al., "Silicon Processing for the VLSI Era, vol. 1: Process Technology," Lattice Press, California, 1986, pp. 191-193.

U.S. Appl. No. 10/737,115, filed Dec. 16, 2003; Method and Apparatus for Elimination of Excessive Field Oxide Recess for Thin SI SOI.

U.S. Appl. No. 10/977,266, filed Oct. 29, 2004; Transistor Structure With Dual Trench for Optimized Stress Effect and Method Thereof.

U.S. Appl. No. 10/977,226, filed Jan. 18, 2005; Semiconductor Device Having Trench Isolation for Differential Stress and Method Therefor.

U.S. Appl. No. 11/132,936, filed May 19, 2005; Electronic Device Including a Trench Field Isolation Region and a Process for Forming the Same.

U.S. Appl. No. 11/409,790, Office Action mailed Feb. 7, 2008.

U.S. Appl. No. 11/409,633, Office Action mailed Apr. 2, 2008.

U.S. Appl. No. 11/409,882, Office Action mailed Apr. 10, 2008.

Wolf, S et al., "Silicon Processing for the VLSI Era, vol. 1: Process Technology," Lattice Press, California, 1986, pp. 541 and 546.

Wolf, S., "Isolation Technologies for Integrated Circuits," Silicon Processing for the VLSI Era, vol. 2: Process Integration; Lattice Press, California, 1990, pp. 39-44.

Actions on the Merits by U.S.P.T.O, as of Dec. 4, 2008, 6 pgs.

* cited by examiner

PROCESS OF FORMING ELECTRONIC DEVICE INCLUDING A DENSIFIED NITRIDE LAYER ADJACENT TO AN OPENING WITHIN A SEMICONDUCTOR LAYER

RELATED APPLICATIONS

The present disclosure is relates to U.S. patent application Ser. No. 11/409,790, entitled "Process of Forming an Electronic Device Including a Layer Formed Using an Inductively Coupled Plasma" by Turner et. al. filed on Apr. 24, 2006, U.S. patent application Ser. No. 11/409,633, entitled "Electronic Device Including a Semiconductor Layer and Another Layer Adjacent To an Opening Within The Semiconductor Layer and a Process of Forming the Same" by Van Gompel et. al. filed on Apr. 24, 2006, and U.S. patent application Ser. No. 11/409,882, entitled "Electronic Device Including a Semiconductor Layer and a Sidewell Spacer and a Process of Forming the Same" by Mora et. al. filed on Apr. 24, 2006, all of which are incorporated by reference in their entireties.

BACKGROUND

1. Field of the Disclosure

The present disclosure relates to electronic devices and processes, and more particularly to electronic devices including semiconductor layers and layers adjacent to openings within semiconductor layers and processes of forming the same.

2. Description of the Related Art

As device performance becomes more and more demanding, semiconductor devices are now formed using semiconductor-on-insulator ("SOI") substrates. In order to achieve a reasonably high component density, field isolation regions are typically formed between semiconductor devices. Typically, a liner layer is formed to help round the top corners of a semiconductor layer to improve gate dielectric integrity.

Figure 1:
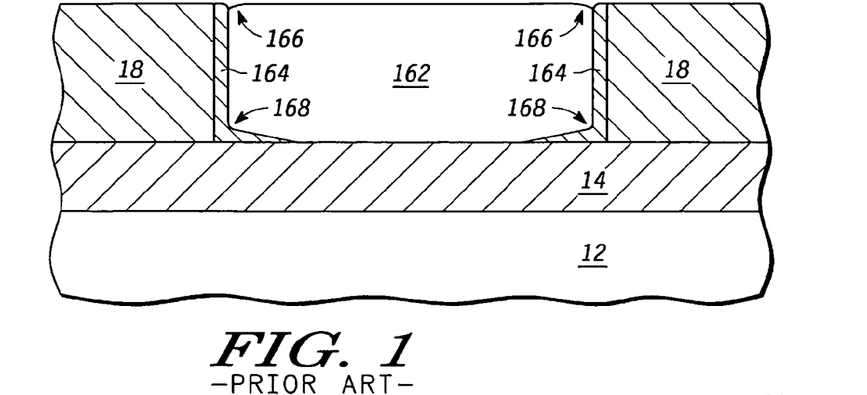
FIG. 1 includes an illustration of a cross-sectional view of a portion of an electronic device that includes an SOI substrate, wherein the semiconductor layer has rounded corners. (Prior Art)

FIG. 1 includes an illustration of a cross-sectional view of a portion of an electronic device. The electronic device includes a substrate 12, an insulating layer 14, which can be a buried oxide, and a semiconductor layer 162 that overlies the insulating layer 14. The semiconductor layer 162 is patterned to form openings that extend through the semiconductor layer 162 to the insulating layer 14. A thermal oxidation is typically performed and grows a liner layer 164. During the formation of the liner layer 164, top corners 166 of the semiconductor layer 162 are rounded in order to improve gate dielectric integrity. However, the thermal oxidation also causes corner rounding near the bottom of the semiconductor layer 162, as seen with rounded bottom corners 168. The rounded bottom corners 168 within the semiconductor layer 162 near the insulating layer 14 are undesired. An insulating layer 18 can then be formed within the openings, with portions of the insulating layer 18 overlying the semiconductor layer 162 being removed using a conventional process. During subsequent thermal cycles, unacceptable levels of stress may be exerted by the field isolation regions (combination of the liner layer 164 and insulating layer 18) onto the semiconductor layer 162. The stress may cause electrical characteristics of the devices to change, defects, faults, fractures to form within the semiconductor layer 162, or, in extreme cases, delamination of the semiconductor layer 162 from the insulating layer 14.

Another attempt to address the bird's beak has been to form the opening extending through the semiconductor layer 162 and form a nitride layer along the bottom of the opening and not form any of the nitride layer along the sidewalls of the semiconductor layer 162 near the upper corners 166. In theory, the upper corners 166 of the semiconductor layer 162 should be exposed during a subsequent thermal oxidation, while the lower corners 168 are protected. The nitride layer can be deposited by evaporating the nitride layer, sputtering the nitride layer, or using a thermal chemical vapor technique. In practice, this technique does not work.

Sputtering is characterized by a long mean free path and no significant surface migration. Along the sidewalls, the nitride layer will be thicker at the upper corners 166 and thinner at the lower corners 168, when measured in a direction perpendicular to the sidewalls of the semiconductor layer 162. A collimator can reduce the sidewall deposition, but the deposition would still be thicker at the upper corners 166 as compared to the lower corners 168. Thus, thermal oxidation would round the upper corners 166 and the lower corners 168. Evaporation is more conformal and less directional as compared to sputtering. Therefore, a significant amount of the nitride layer will deposit along the sidewall.

A thermal chemical vapor deposition is a deposition performed without using a plasma. When forming a nitride layer using low pressure chemical vapor deposition ("LPCVD"), dichlorosilane and ammonia are typically reacted at a temperature in a range of approximately 700° C. to approximately 800° C. under vacuum and without a plasma. The deposition is characterized by a rapid surface migration and forms a substantially conformal nitride layer, which would deposit about the same thickness of nitride along the bottom of the opening as it would along the sidewalls of the semiconductor layer 162. A conformal deposition would deposit nearly equivalent thicknesses of the nitride layer along the sidewall of the semiconductor layer 162.

Therefore, a layer having a significant thickness along a bottom of an opening with no or very little sidewall coverage while protecting the lower corners 168 and allowing rounding of the upper corners 166 of the semiconductor layer 162 has not been enabled. Sputtering and evaporating a nitride layer would deposit a layer along the sidewall that would be locally thicker near the upper corners 166 as compared to the lower corners 168, and a thermal CVD process can produce a conformal layer.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A process of forming an electronic device can include patterning a semiconductor layer to define an opening extending to an insulating layer, wherein the insulating layer lies between a substrate and the semiconductor layer. After patterning the semiconductor layer, the opening can have a bottom, and the semiconductor layer can have a sidewall and a surface. The surface can be spaced apart from the insulating layer, and the sidewall can extend from the surface towards the insulating layer. The process can also include depositing a nitride layer within the opening, wherein depositing is performed using a PECVD technique. The process can further include densifying the nitride layer. The process can still further include removing a part of the nitride layer using an oxide etchant. After removing the part of the nitride layer, a remaining portion of the nitride layer can lie within the opening and adjacent to the bottom and the sidewall, and the remaining portion of the nitride layer can be spaced apart from the surface.

Before addressing details of embodiments described below, some terms are defined or clarified. The term "elevation" is intended to mean the closest distance from a layer, a feature, or a surface of a layer or feature to a reference plane, such as a primary surface of a substrate.

The term "high-k" is intended to mean a dielectric constant of at least 8.0.

The term "PECVD" is intended to mean a chemical vapor deposition performed using a plasma, wherein the plasma is not significantly inductively coupled.

The term "primary surface" is intended to mean a surface of a substrate or a layer overlying the substrate or a portion of the substrate or layer from which a transistor is subsequently formed. The primary surface may be an original surface of a base material before forming any electronic components or may be a surface of the semiconductor layer that overlies the base material. For example, an exposed surface of a semiconductor layer of a semiconductor-on-insulator substrate can be a primary surface, and not the original surface of the base material.

The term "substrate" is intended to mean a base material. An example of a substrate includes a quartz plate, a monocrystalline semiconductor wafer, a semiconductor-on-insulator wafer, etc. The reference point for a substrate is the beginning point of a process sequence.

The term "workpiece" is intended to mean a substrate and, if any, one or more layers one or more structures, or any combination thereof attached to the substrate, at any particular point of a process sequence. Note that the substrate may not significantly change during a process sequence, whereas the workpiece significantly changes during the process sequence. For example, at the beginning of a process sequence, the substrate and workpiece are the same. After a layer is formed over the substrate, the substrate has not changed, but now the workpiece includes the combination of the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B is true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patent, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Figure 2:
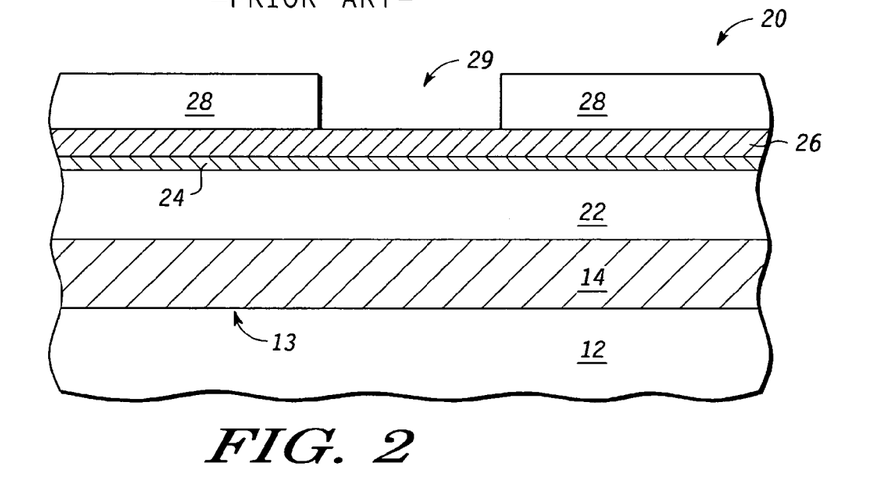
FIG. 2 includes an illustration of a cross-sectional view of a portion of an electronic device workpiece after forming a mask.

FIG. 2 includes an illustration of a cross-sectional view of a portion of an electronic device workpiece 20, which includes a substrate 12, an insulating layer 14, and a semiconductor layer 22. The substrate 12 can include an electronic device substrate, such as a flat panel substrate, a semiconductor device substrate, or another conventional substrate used for forming electronic devices. The insulating layer 14 overlies the substrate 12 at a primary surface 13.

The insulating layer 14 includes an oxide, a nitride, or a combination thereof. The insulating layer 14 (usually referred to as a buried oxide layer or a BOX layer) has a thickness sufficient to substantially reduce parasitic capacitance between the substrate 12 and subsequently formed electronic devices within the semiconductor layer 22. In one embodiment, the insulating layer 14 has a thickness of at least 100 nm.

The semiconductor layer 22 can include a Group 14 element (e.g., C, Si, Ge, etc.), a III-V semiconductor, a II-VI semiconductor, or any combination thereof. In one embodiment, the semiconductor layer 22 is a substantially monocrystalline silicon or silicon germanium layer. The thickness of the semiconductor layer 22 is in a range of approximately 10 to approximately 200 nm. The combination of the substrate 12, insulating layer 14, and semiconductor layer 22 may be obtained from a commercially available source or the insulating layer 14 and semiconductor layer 22 can be formed from or over the substrate 12 using a conventional or proprietary processing sequence.

A pad layer 24 and an oxidation-resistant layer 26 are formed over the semiconductor layer 22, as illustrated in FIG. 2. In one embodiment, the pad layer 24 includes an oxide (e.g., silicon dioxide, silicon oxynitride, etc.) that is thermally grown from or deposited over the semiconductor layer 22, and the oxidation-resistant layer 26 includes a nitride (e.g., silicon nitride, silicon-rich silicon nitride, etc.) that is deposited over the pad layer 24. In one non-limiting embodiment, the pad layer 24 can have a thickness in a range of approximately 2 to approximately 40 nm, and the oxidation-resistant layer 26 can have a thickness in a range of approximately 10 to approximately 200 nm.

A mask 28 is formed over the pad layer 24 and the oxidation-resistant layer 26 using a conventional or proprietary lithographic technique to define an opening 29. In one embodiment, the mask 28 includes a resist material, such as photoresist or deep ultraviolet resist.

Figure 3:
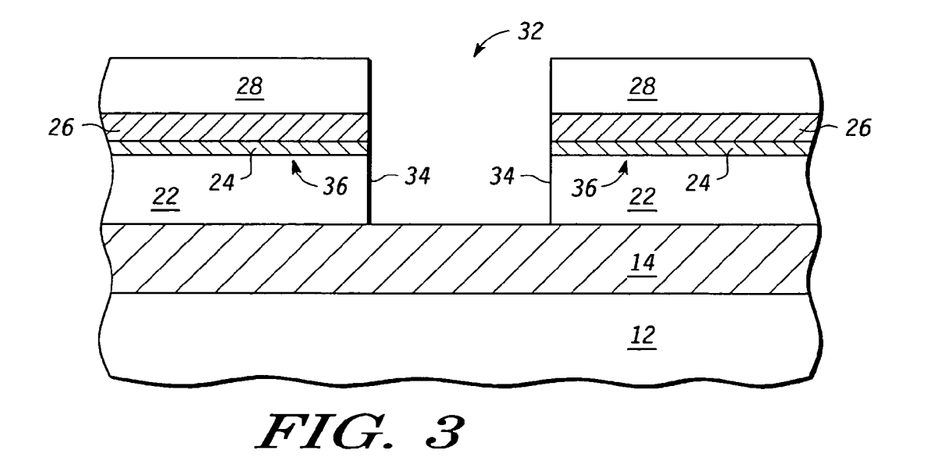
FIG. 3 includes an illustration of a cross-sectional view of the workpiece of FIG. 2 after forming an opening extending through a semiconductor layer.

As illustrated in FIG. 3, the oxidation-resistant layer 26, the pad layer 24, and the semiconductor layer 22 are patterned to form an opening 32 that extends through those layers to expose the insulating layer 14 along a bottom of the opening 32. The semiconductor layer 22 includes surface 36 that is spaced apart from the insulating layer 14. After forming the opening 32, the semiconductor layer 22 includes sidewalls 34 lying along the opening 32 and extending from the surfaces 36 towards the insulating layer 14. In one embodiment, the openings in the oxidation-resistant layer 26 and the pad layer 24 and the sidewalls 34 of the opening 32 are substantially coterminous with one another. The sidewalls 34 can be substantially vertical or may include a slight taper (i.e., slightly off vertical).

In one embodiment, the oxidation-resistant layer 26 includes silicon nitride, the pad layer 24 includes silicon dioxide, and the semiconductor layer 22 includes silicon or silicon germanium. The opening 32 can be formed by dry etching the layers. Different etch chemistries can be used during the etch. The oxidation-resistant layer 26 can be etched using an etch chemistry that is tailored for silicon nitride and has good selectivity to oxide. The pad layer 24 can be etched using an etch chemistry that is tailored for silicon dioxide and has good selectivity to silicon or silicon germanium. The semiconductor layer 22 can be etched using an etch chemistry that tailored to silicon or silicon germanium. The same etch chemistries can be used for combinations of some of the layers. For example, the same etch chemistry may be used for the oxidation-resistant layer 26 and pad layer 24. Such etch chemistry may have good selectivity to silicon or silicon germanium. Alternatively, the same etch chemistry may be used for the pad layer 24 and the semiconductor layer 22. Still other etch chemistries can be used, particularly if the composition of the oxidation-resistant layer 26, the pad layer 24, the semiconductor layer 22, or any combination thereof would be different from those previously described. After reading this specification, skilled artisans will be able to select etch chemistries that meet their needs or desires. Each of etching of the oxidation-resistant layer 26, the pad layer 24, and the semiconductor layer 22 may be performed as a timed etch or using endpoint detection with an optional timed overetch.

After the opening 32 has been formed, the mask 28 can be removed using a conventional or proprietary ashing technique. In an alternative embodiment, the mask 28 can be removed after patterning the oxidation-resistant layer 26, after patterning the pad layer 24, or after forming the opening 32. In one embodiment, the oxidation-resistant layer 26 or combination of the oxidation-resistant layer 26 and the pad layer 24 can act as a hard mask while etching the opening 32 into the semiconductor layer 22.

Figure 4:
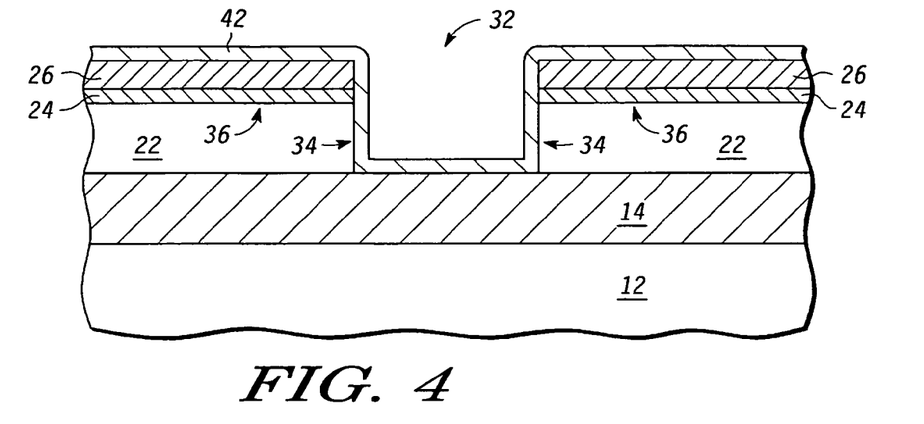
FIG. 4 includes an illustration of a cross-sectional view of the workpiece of FIG. 3 after depositing a nitride layer over the semiconductor layer and within the opening in accordance with an embodiment.

A nitride layer 42 can be deposited over the substrate 12 and within the opening 32. The nitride layer 42 can include a nitride. An example of a nitride can include silicon nitride, germanium nitride, silicon oxynitride, germanium oxynitride, another suitable nitride material used in semiconductor devices and capable of withstanding a processing temperature of at least 1000° C., or any combination thereof. The thickness of the nitride layer 42 can be in a range of approximately 5% to approximately 50% of the thickness of the semiconductor layer 22, and in a particular embodiment, the thickness of the nitride layer 42 can be in a range of approximately 20% to approximately 40% of the first thickness. In a particular embodiment, the thickness of the nitride layer 42 can be in a range of approximately 15 to 25 nm.

In one embodiment, the nitride layer 42 may be deposited using a PECVD technique using conventional or proprietary deposition parameters. The PECVD technique can deposit the material substantially conformally, i.e., at about the same thickness along all exposed surfaces of the workpiece. In another embodiment, the thickness of the nitride layer 42 along the sidewalls 34 may be at least approximately 70% of the thickness of the nitride layer 42 overlying the oxidation-resistant layer 26. The PECVD technique can be performed without an inductively coupled plasma. The nitride layer 42 lies along the bottom 38 of the opening 32 and along the sidewalls 34 of the opening 32.

Figure 5:
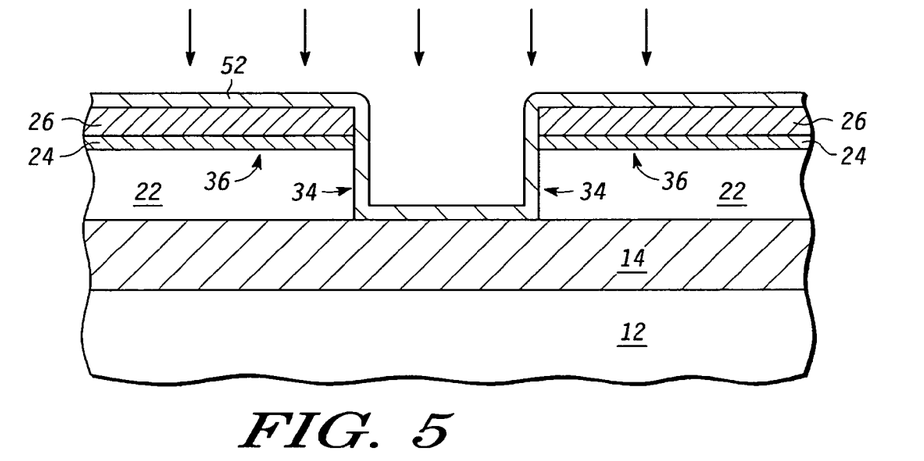
FIG. 5 includes an illustration of a cross-sectional view of the workpiece of FIG. 5 after densifying the nitride layer in accordance with the embodiment.

In FIG. 5, the nitride layer 42 can be densified (illustrated by arrows) to form a densified nitride layer 52. The densification can be performed at a temperature of at least approximately 800° C. for a time period no greater than approximately 60 minutes. In a particular embodiment, the densification can be performed at a temperature in a range of approximately 1000° C. to approximately 1200° C. for a time period in a range of approximately 5 to approximately 20 minutes. The densification can be performed in an ambient including a noble gas, such as helium, neon, argon, xenon, radon, or any combination thereof. In a particular embodiment, the ambient does not include nitrogen or oxygen to reduce the likelihood of nitridizing or oxidizing the sidewalls 34 of the semiconductor layer 22.

Figure 6:
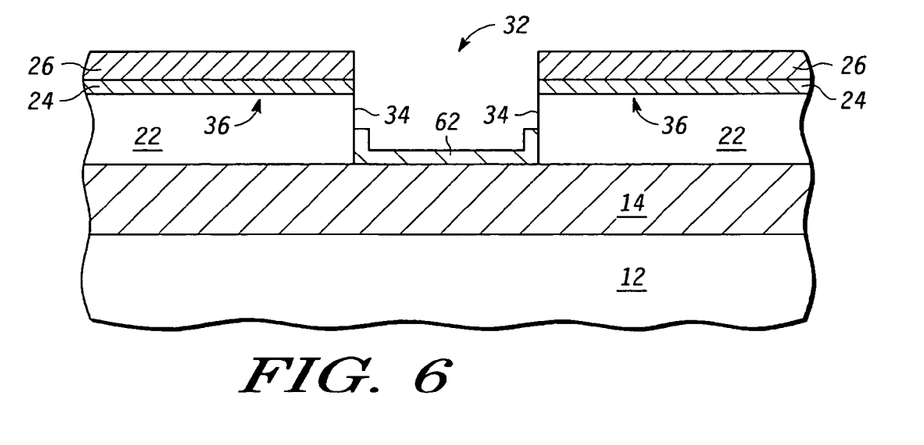
FIG. 6 includes an illustration of a cross-sectional view of the workpiece of FIG. 6 after forming a remaining layer having extended portions in accordance with an alternative embodiment.

An etch can be performed to remove part of the densified nitride layer 52 to leave a remaining portion 62 along the bottom of the opening 32 in FIG. 6. Unexpectedly, the densified nitride layer 52 is removed from over the oxidation-resistant layer 26 and along the upper portions of the sidewalls 34; however, portions of the densified nitride layer 52 along the bottom of the trench 32 and along the lower portions of the sidewalls 34 remain. The portions of the densified nitride layer 52 at locations further from the bottom of the opening 32 have a higher etch rate. In one embodiment, the etch does not remove a significant portion of the oxidation-resistant layer 26.

The etch may be performed using a wet or dry oxide etchant. In one embodiment, the etch can be performed as an isotropic etch. In particular embodiment, a wet chemical etchant can be performed using a solution including HF, or a dry etch can be performed using an ambient including HF (e.g., HF vapor). In a more particular embodiment, the densified nitride layer 52 can be exposed to a solution including HF having an oxide etch rate in a range of approximately 1 to approximately 4 nm/minute for a time period in a range of approximately 5 to approximately 20 minutes. The etch may be performed in a partial drain refill tank. By using the partial drain refill tank, etching characteristics may be more uniform between different lots of workpieces. In another embodiment, the partial drain refill tank is not used, but a static tank (e.g., no recirculation loop) may be used.

After the etch, the remaining portion 62 can include extended portions 64 that extend above another part of the remaining portion 62 that lies at a center of the opening 32. The extended portions 64 have sidewall elevations that correspond to the highest elevations of the remaining portion 62. At the center of the opening 32, the remaining portion 62 can have a center elevation, wherein the sidewall elevation is higher than the center elevation. The surface 36 of the semiconductor layer 22 lies at a surface elevation. The sidewall elevation lies below the surface elevation. Each of the sidewall elevation, the center elevation, and the surface elevation can be measured from the primary surface 13 of the substrate 12. In one embodiment, the extended portions 64 extend to an elevation no higher than approximately 80% of the thickness of the semiconductor layer 22. In a more particular embodiment, the extended portions 64 extend to an elevation that is approximately 30% to approximately 60% of the thickness of the semiconductor layer 22.

Figure 7:
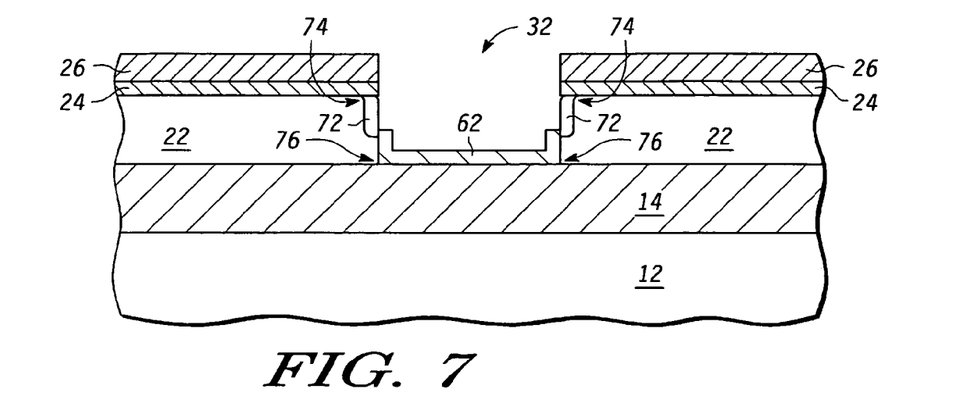
FIG. 7 includes an illustration of a cross-sectional view of the workpiece of FIG. 6 after rounding corners of the semiconductor layer near the top of the semiconductor layer.

A liner layer 72 can be formed along the exposed surfaces of the semiconductor layer 22, as illustrated in FIG. 7. The liner layer 72 can include one or more insulating films. In one embodiment, the liner layer 72 is formed by thermally oxidizing a portion of the semiconductor layer 22 using an oxygen-containing ambient (e.g., $O_2$, $O_3$, $N_2O$, another suitable oxidizing species, or any combination thereof). The oxidation-resistant layer 26 does not significantly oxidize during the thermal oxidation, and therefore can act as an oxidation mask during thermal oxidation. In one embodiment, the liner layer 72 has a thickness in a range of approximately 1 to approximately 20 nm, and in a more particular embodiment, in a range of approximately 7 to approximately 11 nm.

The thermal oxidation can cause corner rounding of semiconductor layer 22, adjacent to the pad layer 24, which results in rounded corners 74. The rounded corners 74 lie at or near the top of the sidewalls 34 of the semiconductor layer 22. The rounded corners 74 help to improve gate dielectric layer integrity. The remaining portion 62 slows or substantially prevents oxidation of the semiconductor layer 22 at the corners 76 adjacent to the insulating layer 14. Thus, the remaining portion 62 allows the liner layer 72 to be thicker than if liner layer 72 was formed when no remaining portion would be present adjacent to the bottom of the semiconductor layer 22.

In an alternative embodiment, the liner layer 72 can include one or more other insulating films that can be used in conjunction with or in place of the thermal oxide film. In one embodiment, a nitride film can be deposited using a conventional technique over the thermal oxide film. The nitride film can have a thickness in a range of approximately 1 to approximately 5 nm and may help to reduce erosion of the oxide film within the liner layer 72 during subsequent oxide etches, for example, when removing the pad layer 24, when forming and removing a sacrificial layer before forming a gate dielectric layer of the electronic device, etc.

In an alternative embodiment (not illustrated), the remaining portion 62 can optionally be removed at this point in the process. For example, if the remaining portion 62 includes a metallic element, the removal may reduce the likelihood of adverse consequences (due to the presence of the metallic element throughout the remainder of the process sequence).

Figure 8:
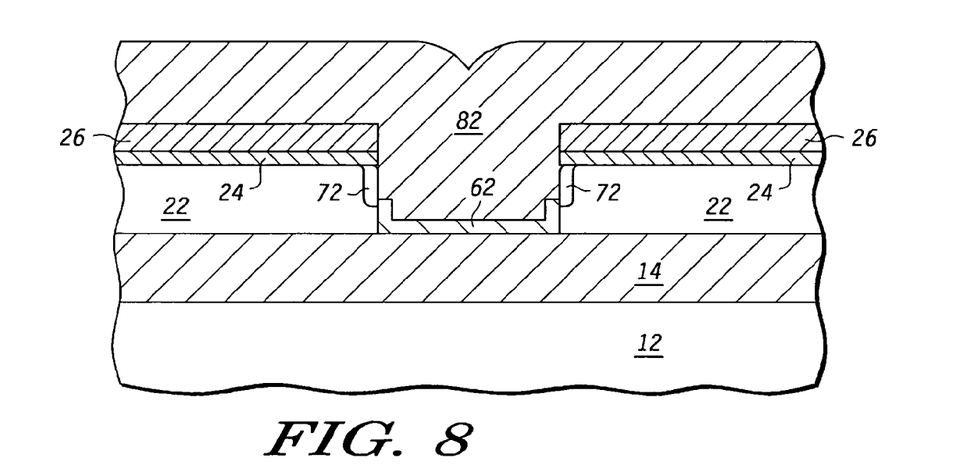
FIG. 8 includes an illustration of a cross-sectional view of the workpiece of FIG. 7 after forming an insulating layer that fills the opening.

An insulating layer 82 is formed and substantially fills the rest of the opening 32, as illustrated in FIG. 8. The insulating layer 82 can include an oxide, a nitride, an oxynitride, or a combination thereof and can be deposited using a conventional or proprietary technique. In one specific embodiment, the insulating layer 82 is formed by depositing an oxide film from tetraethylorthosilicate (TEOS) to a thickness that is at least one half the depth of the opening 32, and typically is as thick as the depth of the opening 32. The insulating layer 82 may have an undulating upper surface, a substantially flat upper surface, or something in-between.

Figure 9:
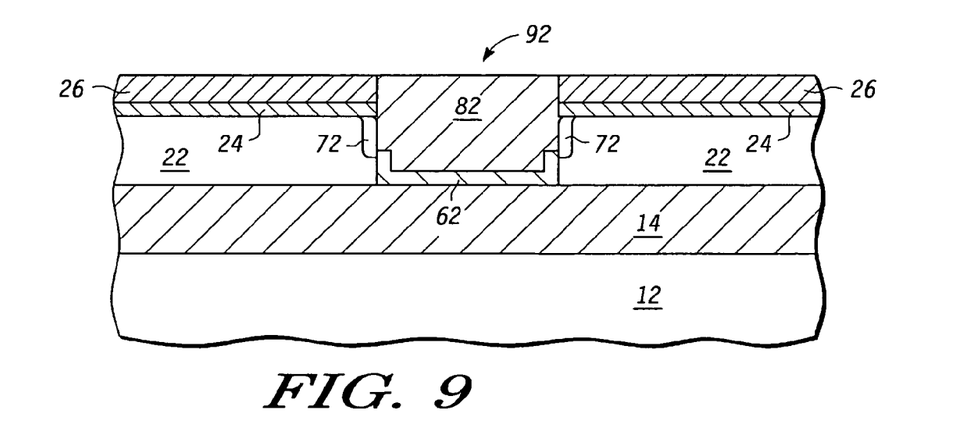
FIG. 9 includes an illustration of a cross-sectional view of the workpiece of FIG. 8 after forming a field isolation region is substantially completed.

Portions of the insulating layer 82 lying outside the opening 32 and overlying the oxidation-resistant layer 26 are removed to form a field isolation region 92, as illustrated in FIG. 9. The field isolation region 92 includes the remaining portion 62, the liner layer 72, and the insulating layer 82. In one embodiment, a conventional or proprietary chemical-mechanical polishing technique can be used, wherein the oxidation-resistant layer 26 can also act as a polish-stop layer. In another embodiment, the polishing operation could be continued until another layer underlying the oxidation-resistant layer 26 is reached.

In another embodiment, a conventional or proprietary etching process can be performed until the oxidation-resistant layer 26 is exposed, wherein the oxidation-resistant layer 26 can also act as an etch-stop layer. The etching may be performed as a timed etch or using endpoint detection (detecting the oxidation-resistant layer 26 has been reached) with a timed overetch. In one particular embodiment when the insulating layer 82 has an undulating surface, as deposited, a conventional or proprietary resist-etch-back process can be used. As the insulating layer 82 is etched, the etch chemistry may be changed before the oxidation-resistant layer 26 is reached to improve the etch selectivity (e.g., ratio of oxide etch rate to nitride etch rate is increased), and thus, decrease the likelihood of removing substantially all of the oxidation-resistant layer 26.

Figure 10:
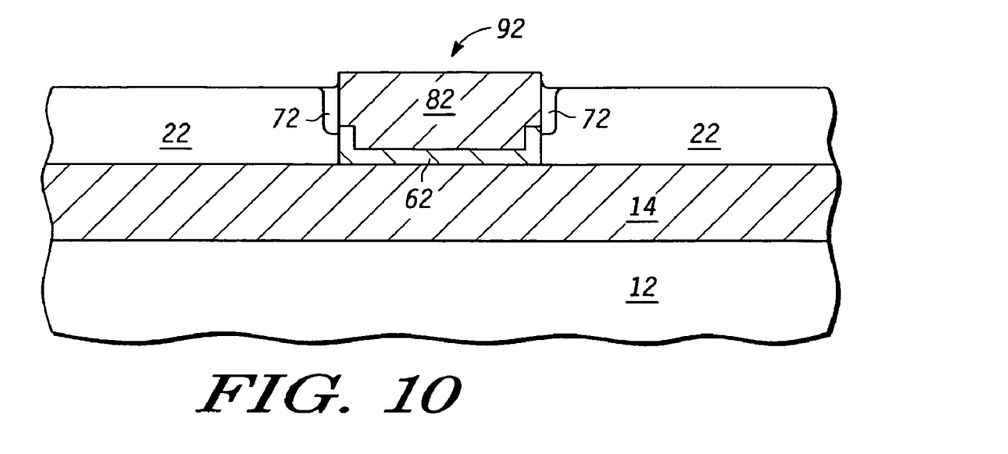
FIG. 10 includes an illustration of a cross-sectional view of the workpiece of FIG. 9 after removing remaining portions of layers overlying the semiconductor layer.

In FIG. 10, remaining portions of the oxidation-resistant layer 26 and the pad layer 24 are removed using a conventional or proprietary technique, if not previously removed when removing portions of the insulating layer 82 that were outside the opening 32. A wet etching technique, dry etching technique, or any combination thereof can be used to remove the oxidation-resistant layer 26, the pad layer 24, or both. In one embodiment, a dilute HF solution can be used to remove the pad layer 24. Relatively small amounts of the liner layer 72 and the insulating layer 82 may be removed if the pad layer 24, the liner layer 72, and the insulating layer 82 comprise substantially the same material (e.g., $SiO_2$). Such relatively small amounts typically do not significantly adversely affect the electronic device. Because the remaining portion 62 is spaced apart from both the oxidation-resistant layer 26 and the pad layer, etchants used to remove the oxidation-resistant layer 26 and the pad layer 24 will not reach the remaining portion 62 and etch a portion of the remaining portion 62. Thus, a likelihood of forming a void is substantially eliminated.

In another embodiment, not illustrated, a sacrificial oxide layer can be grown and removed at this point in the process. The sacrificial oxide layer can help to improve the surface quality of the semiconductor layer 22 before a gate dielectric layer or another layer is subsequently formed. The thickness of the sacrificial layer can be in a range of approximately 1 to approximately 20 nm. The sacrificial oxide layer may be formed in addition to or instead of the liner layer 72. If the liner layer 72 would not be formed, the sacrificial oxide layer can help to round the upper corners of the semiconductor layer 22 before a gate dielectric layer would be formed. The sacrificial oxide layer can be formed and removed using a conventional or proprietary process.

Figure 11:
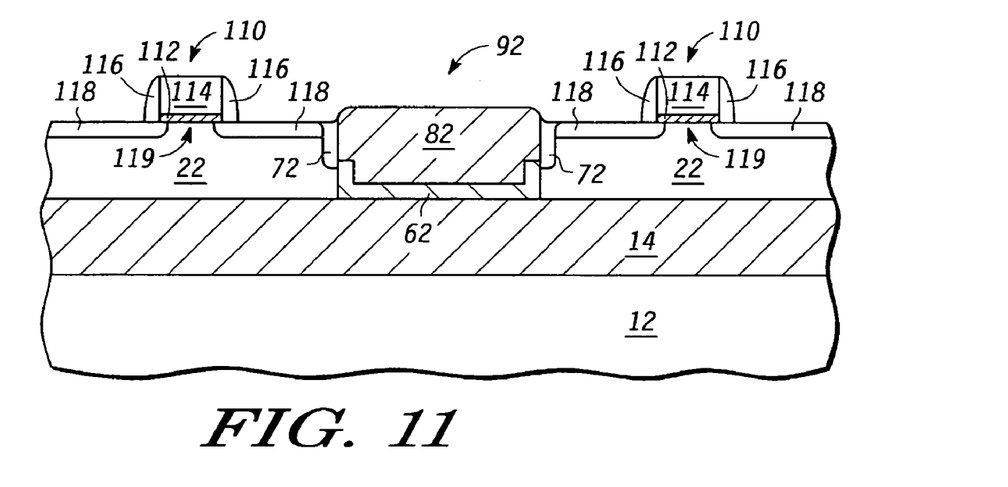
FIG. 11 includes an illustration of a cross-sectional view of the workpiece of FIG. 10 after forming electronic components.

At this point in the process, electronic components, such as transistors 110, can be formed, as illustrated in FIG. 11. In one embodiment, the transistors 110 will have their active regions (i.e., source/drain and channel regions) formed within the semiconductor layer 22. The transistors 110 include an n-channel transistor, a p-channel transistor, or any combination thereof. Other electronic components, including a resistor, a capacitor, or any combination thereof, can be formed from portions of the semiconductor layer 22, if desired.

Optionally, a well dopant (not illustrated), a separate threshold adjust dopant, or other dopants may be introduced into portions of the semiconductor layer 22. An optional thermal cycle may be performed to activate the dopant(s). In another embodiment, the dopant(s) may be activated during subsequent processing.

A gate dielectric layer 112 is formed over the semiconductor layer 22, as illustrated in FIG. 11. The gate dielectric layer 112 can be formed using a conventional or proprietary growth technique, a deposition technique, or any combination thereof. The gate dielectric layer 112 can include one or more films of silicon dioxide, silicon nitride, silicon oxynitride, a metal-containing oxide, a metal-containing nitride, a metal-containing oxynitride, another high-k material, or any combination thereof. The gate dielectric layer 112 can have a thickness in a range of approximately 5 to approximately 50 nm in a substantially completed electronic device. In an alternative embodiment, the transistors 110 may have gate dielectric layers with different compositions, a different number of films within each gate dielectric layer, significantly different thicknesses, or any combination thereof.

Gate electrodes 114 are formed over the gate dielectric layer 112 using a conventional deposition and etch processing sequence. Each of the gate electrodes 114 can include one or more layers. The gate electrodes 114 can include a heavily doped amorphous silicon or polycrystalline silicon layer, a metal-containing layer, another suitable conductive layer, or any combination thereof. Each of the gate electrodes 114 has a thickness in a range of approximately 50 to approximately 300 nm. In an alternative embodiment, the transistors 110 may have gate electrodes with different compositions, a different number of films within each gate electrode, significantly different thicknesses, or any combination thereof.

The gate dielectric layer 112 and the gate electrodes 114 extend into and out of the drawing as illustrated in FIG. 11. Although not illustrated, the gate electrodes 114 may extend over the field isolation region 92 or a different field isolation region that is substantially similar to the field isolation region 92. Thus, each of the gate dielectric layer 112 and the gate electrodes 114 may lie adjacent to the surface 36 of the semiconductor layer 22 and adjacent to one or more of the rounded corners 74 of the semiconductor layer 22 (see FIG. 7).

An optional sidewall oxide layer (not illustrated) can be grown from exposed sides of the gate electrodes 114 to protect the gate electrodes 114 during subsequent processing. The thickness of the optional sidewall oxide layer can be in a range of approximately 2 to approximately 15 nm.

Sidewall spacers 116 and source/drain ("S/D") regions 118 can be formed. In one embodiment, dopants for extension regions can be implanted after forming the gate electrodes 114 and before forming the sidewall spacers 116. The sidewall spacers 116 can be formed using conventional deposition techniques and may include an oxide layer, a nitride layer, or a combination thereof. Dopants for heavily doped regions can be implanted after forming the sidewall spacers 116. A thermal cycle can be performed to activate the dopants to form the S/D regions 118, which include extension and heavily doped regions. Portions of the semiconductor layer 22 lying under the gate electrodes 114 and between the S/D regions 118 are channel regions 119. At this point in the process, transistors 110 have been formed. Although not illustrated in FIG. 11, silicided regions can be formed from or over the gate electrodes 114, S/D regions 118, or any combination thereof. The silicided regions can be formed using a conventional or proprietary process.

Processing can be continued to form a substantially completed electronic device. One or more insulating layers, one or more conductive layers, and one or more passivating layers are formed using conventional techniques.

Embodiments as described herein can be used to provide benefits that overcome the problems with conventional structures and processes. The formation of the remaining portion 62 before forming the rounded corners 74 helps to reduce or substantially eliminate the bird's beak formation that would occur if the bottom corner of the semiconductor layer 22 would be exposed when forming the rounded corners 74. Also, the presence of the remaining portion 62 can help to redirect the stress on the semiconductor layer 22, such that compressive stress on the semiconductor layer 22 is reduced. Electrical performance of transistors, particularly n-channel transistors, can be improved as compared to transistors formed adjacent to the field isolation region 18 in FIG. 1. Also, the remaining portion 62 is spaced apart from oxidation-resistant layer 26 and the pad layer 24, and therefore, the likelihood of forming a void from the remaining portion 62 during the removal of the oxidation-resistant layer 26 or the pad layer 24 is substantially eliminated.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include patterning a semiconductor layer to define an opening extending to an insulating layer, wherein the insulating layer lies between a substrate and the semiconductor layer. After patterning the semiconductor layer, the opening can have a bottom, and the semiconductor layer can have a sidewall and a surface. The surface can be spaced apart from the insulating layer, and the sidewall can extend from the surface towards the insulating layer. The process can also include depositing a nitride layer within the opening, wherein depositing is performed using a PECVD technique. The process can further include densifying the nitride layer. The process can still further include removing a part of the nitride layer using an oxide etchant. After removing the part of the nitride layer, a remaining portion of the nitride layer can lie within the opening and adjacent to the bottom and the sidewall, and the remaining portion of the nitride layer can be spaced apart from the surface.

In one embodiment of the first aspect, the semiconductor layer can have a first thickness, and depositing the nitride layer can include depositing the nitride layer to a second thickness in a range of approximately 5% to approximately 50% of the first thickness. In a particular embodiment, depositing the nitride layer can include depositing the nitride layer to the second thickness in a range of approximately 20% to approximately 40% of the first thickness. In another embodiment, densifying the nitride layer can be performed at a temperature of at least approximately 800° C. In a particular embodiment, densifying the nitride layer can be performed at the temperature in a range of approximately 1000° C. to approximately 1200° C. In a more particular embodiment, densifying the nitride layer is performed using an ambient consisting essentially of a noble gas. In another more particular embodiment, densifying the nitride layer can be performed for a time period no greater than approximately 60 minutes.

In still another embodiment of the first aspect, removing the part of the nitride layer can be performed using a solution including HF. In a particular embodiment, removing the part of the nitride layer can performed using the solution, wherein the solution has an oxide etch rate in a range of approximately 1 to approximately 4 nm/minute, and the nitride layer is exposed to the solution for a time period in a range of approximately 5 to approximately 20 minutes.

In yet another embodiment of the first aspect, removing the part of the nitride layer can include removing the part of the nitride layer, wherein, as seen from a cross-sectional view, the remaining portion has an extended portion. The extended portion can lie adjacent to the sidewall of the semiconductor layer. The extended portion can also have a highest elevation that lies above a center elevation of the remaining portion at a center of the opening and below a surface elevation of the surface of the semiconductor layer, wherein each of the highest elevation, the center elevation, and the surface elevation is measured from a primary surface of the substrate. In a further embodiment, removing the part of the nitride layer can include removing the part of the nitride layer that lies outside the opening in the semiconductor layer.

In another further embodiment of the first aspect, the process can further include oxidizing the semiconductor layer. The semiconductor layer can include a first corner and a second corner, wherein the first corner is adjacent to the surface, and the second corner is adjacent to the insulating layer, and the first corner becomes rounded during oxidizing the semiconductor layer. The second corner can substantially maintain its shape during oxidizing the semiconductor layer. In a particular embodiment, the process can further include depositing an oxide layer that substantially fills a rest of the opening and polishing the oxide layer to remove a portion of the oxide layer lying outside the opening. In a more particular embodiment, the process can further include forming a patterned oxidation-resistant layer over the semiconductor layer before patterning the semiconductor layer and removing the patterned oxidation-resistant layer after polishing the oxide layer. In another particular embodiment, the process can further include forming a gate dielectric layer adjacent to the surface and the first corner of the semiconductor layer. In a more particular embodiment, the process can further include forming a gate electrode, wherein the gate dielectric layer lies between the semiconductor layer and the gate electrode, and the gate electrode lies adjacent to the surface and the first corner of the semiconductor layer.

In a second aspect, a process of forming an electronic device can include forming a patterned oxidation-resistant layer over a semiconductor layer, wherein an insulating layer lies between a substrate and the semiconductor layer. The process can also include patterning the semiconductor layer to define an opening extending to the insulating layer. After patterning the semiconductor layer, the opening can have a bottom, and the semiconductor layer has a sidewall and a surface, wherein the surface is spaced apart from the insulating layer, and the sidewall extends from the surface towards the insulating layer. The process can further include depositing a nitride layer within the opening, wherein depositing is performed using a PECVD technique, densifying the nitride layer, and exposing the nitride layer to a solution including HF. After exposing the nitride layer to the solution, a remaining portion of the nitride layer can lie within the opening and adjacent to the bottom and the sidewall, and the remaining portion of the nitride layer can be spaced apart from the surface.

The process of the second aspect can also include oxidize the semiconductor layer after exposing the nitride layer to the solution. The process can further include depositing an oxide layer that substantially fills a rest of the opening, and polishing the oxide layer to remove a portion of the oxide layer lying outside the opening. The process can still further include removing the patterned oxidation-resistant layer after polishing the oxide layer. The process can still further include forming a gate dielectric layer adjacent to the surface of the semiconductor layer, and forming a gate electrode, wherein the gate dielectric layer lies between the semiconductor layer and the gate electrode.

In one embodiment of the second aspect, densifying the nitride layer can be performed at a temperature in a range of approximately 1000° C. to approximately 1200° C., for a time period in a range of approximately 5 to approximately 60 minutes, and using an ambient including argon. In another embodiment, removing the part of the nitride layer can be performed using the solution, wherein the solution has an oxide etch rate in a range of approximately 1 to approximately 4 nm/minute, and the nitride layer is exposed to the solution for a time in a range of approximately 5 to approximately 20 minutes. In still another embodiment, oxidizing the semiconductor layer can be performed such that the semiconductor layer includes a first corner and a second corner, wherein the first corner is adjacent to the surface, and the second corner is adjacent to the insulating layer. The first corner can become rounded during oxidizing the semiconductor layer, and the second corner can substantially maintain its shape during oxidizing the semiconductor layer.

Note that not all of the activities described above in the general description or the examples are required, that a portion of a specific activity may not be required, and that one or more further activities may be performed in addition to those described. Still further, the order in which activities are listed is not necessarily the order in which they are performed.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that a structural substitution, logical substitution, or another change may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed subject matter requires more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
    patterning a semiconductor layer to define an opening extending to an insulating layer,
        wherein the insulating layer lies between a substrate and the semiconductor layer,
        wherein after patterning the semiconductor layer:
            the opening has a bottom;
            the semiconductor layer has a sidewall and a surface;
            the surface is spaced apart from the insulating layer; and
            the sidewall extends from the surface towards the insulating layer;
    depositing a nitride layer within the opening, wherein depositing is performed using a PECVD technique;
    densifying the nitride layer; and
    removing a part of the nitride layer using an oxide etchant, wherein after removing the part of the nitride layer, a remaining portion of the nitride layer lies within the opening and adjacent to the bottom and the sidewall, and the remaining portion of the nitride layer is spaced apart from the surface, and wherein removing the part of the nitride layer comprises removing the part of the nitride layer that lies outside the opening in the semiconductor layer.

2. The process of claim 1, wherein removing the part of the nitride layer comprises removing the part of the nitride layer, wherein, as seen from a cross-sectional view, the remaining portion has an extended portion, wherein the extended portion:
    lies adjacent to the sidewall of the semiconductor layer; and
    has a highest elevation that lies above a center elevation of the remaining portion at a center of the opening and below a surface elevation of the surface of the semiconductor layer, wherein each of the highest elevation, the center elevation, and the surface elevation is measured from a primary surface of the substrate.

3. The process of claim 1, wherein:
    the semiconductor layer has a first thickness; and
    depositing the nitride layer comprises depositing the nitride layer to a second thickness in a range of approximately 5% to approximately 50% of the first thickness.

4. The process of claim 3, wherein depositing the nitride layer comprises depositing the nitride layer to the second thickness in a range of approximately 20% to approximately 40% of the first thickness.

5. The process of claim 1, wherein densifying the nitride layer is performed at a temperature of at least approximately 800° C.

6. The process of claim 5, wherein densifying the nitride layer is performed at the temperature in a range of approximately 1000° C. to approximately 1200° C.

7. The process of claim 6, wherein densifying the nitride layer is performed using an ambient consisting essentially of a noble gas.

8. The process of claim 6, wherein densifying the nitride layer is performed for a time period no greater than approximately 60 minutes.

9. The process of claim 1, wherein removing the part of the nitride layer is performed using a solution comprising HF.

10. The process of claim 9, wherein removing the part of the nitride layer is performed using the solution, wherein:
    the solution has an oxide etch rate in a range of approximately 1 to approximately 4 nm/minute; and
    the nitride layer is exposed to the solution for a time period in a range of approximately 5 to approximately 20 minutes.

11. The process of claim 1, further comprising oxidizing the semiconductor layer, wherein:
    the semiconductor layer includes a first corner and a second corner;
    the first corner is adjacent to the surface, and the second corner is adjacent to the insulating layer;
    the first corner becomes rounded during oxidizing the semiconductor layer; and
    the second corner substantially maintains its shape during oxidizing the semiconductor layer.

12. The process of claim 11, further comprising:
    depositing an oxide layer that substantially fills a rest of the opening; and
    polishing the oxide layer to remove a portion of the oxide layer lying outside the opening.

13. The process of claim 12, further comprising:
    forming a patterned oxidation-resistant layer over the semiconductor layer before patterning the semiconductor layer; and
    removing the patterned oxidation-resistant layer after polishing the oxide layer.

14. The process of claim 11, further comprising forming a gate dielectric layer adjacent to the surface and the first corner of the semiconductor layer.

15. The process of claim 14, further comprising forming a gate electrode, wherein:
- the gate dielectric layer lies between the semiconductor layer and the gate electrode; and
- the gate electrode lies adjacent to the surface and the first corner of the semiconductor layer.

16. The process of claim 1, wherein patterning the semiconductor layer comprises patterning the semiconductor layer, wherein the semiconductor layer comprises germanium.

17. A process of forming an electronic device comprising:
- forming a patterned oxidation-resistant layer over a semiconductor layer, wherein an insulating layer lies between a substrate and the semiconductor layer;
- patterning the semiconductor layer to define an opening extending to the insulating layer, wherein after patterning the semiconductor layer:
  - the opening has a bottom;
  - the semiconductor layer has a sidewall and a surface;
  - the surface is spaced apart from the insulating layer; and
  - the sidewall extends from the surface towards the insulating layer;
- depositing a nitride layer within the opening, wherein depositing is performed using a PECVD technique;
- densifying the nitride layer;
- exposing the nitride layer to a solution including HF, wherein after exposing the nitride layer to the solution, a remaining portion of the nitride layer lies within the opening and adjacent to the bottom and the sidewall, and the remaining portion of the nitride layer is spaced apart from the surface;
- oxidizing the semiconductor layer after exposing the nitride layer to the solution;
- depositing an oxide layer that substantially fills a rest of the opening;
- polishing the oxide layer to remove a portion of the oxide layer lying outside the opening;
- removing the patterned oxidation-resistant layer after polishing the oxide layer;
- forming a gate dielectric layer adjacent to the surface of the semiconductor layer; and
- forming a gate electrode, wherein the gate dielectric layer lies between the semiconductor layer and the gate electrode.

18. The process of claim 17, wherein densifying the nitride layer is performed:
- at a temperature in a range of approximately 1000° C. to approximately 1200° C.;
- for a time period in a range of approximately 5 to approximately 60 minutes; and
- using an ambient including argon.

19. The process of claim 17, wherein removing the part of the nitride layer is performed using the solution, wherein:
- the solution has an oxide etch rate in a range of approximately 1 to approximately 4 nm/minute; and
- the nitride layer is exposed to the solution for a time in a range of approximately 5 to approximately 20 minutes.

20. The process of claim 17, wherein oxidizing the semiconductor layer is performed such that:
- the semiconductor layer includes a first corner and a second corner;
- the first corner is adjacent to the surface, and the second corner is adjacent to the insulating layer;
- the first corner becomes rounded during oxidizing the semiconductor layer; and
- the second corner substantially maintains its shape during oxidizing the semiconductor layer.

* * * * *